(12) United States Patent
Lee

(10) Patent No.: US 6,449,209 B1
(45) Date of Patent: Sep. 10, 2002

(54) SEMICONDUCTOR MEMORY DEVICE COMPRISING MORE THAN TWO INTERNAL BANKS OF DIFFERENT SIZES

(75) Inventor: Dong Yang Lee, Sungnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/765,963

(22) Filed: Jan. 19, 2001

(51) Int. Cl.[7] ............................... G11C 8/00
(52) U.S. Cl. ..................... 365/230.03; 365/189.04; 365/235
(58) Field of Search .............. 365/230.03, 149, 365/189.04, 230.08, 233, 235

(56) References Cited

U.S. PATENT DOCUMENTS

| | | | |
|---|---|---|---|
| 5,412,613 A | * 5/1995 | Galbi et al. | 365/230.03 |
| 5,638,321 A | * 6/1997 | Lee et al. | 365/185.17 |
| 6,104,641 A | 8/2000 | Itou | 365/189.01 |
| 6,111,787 A | * 8/2000 | Akaogi et al. | 365/185.11 |
| 6,130,836 A | * 10/2000 | Matsubara et al. | 365/185.03 |

* cited by examiner

Primary Examiner—Richard Elms
Assistant Examiner—Van Thu Nguyen
(74) Attorney, Agent, or Firm—Skjerven Morrill LLP

(57) ABSTRACT

A semiconductor memory device includes a plurality of internal banks of different sizes. The internal banks are suitable for and correspond to the memory needs of a plurality of master devices. Master devices are assigned banks having sizes matched to the needs of the master devices so that inclusion of multiple buffers in a bank can be avoided. A master device that requires a small buffer is assigned a memory bank having a small size, and an external master that requires a large amount of memory is assigned a large bank. Reduction of the average number of master devices sharing each bank improves performance by reducing the number of page misses caused when different master interleave accesses of different pages in the same bank.

24 Claims, 4 Drawing Sheets

SEMICONDUCTOR MEMORY DEVICE COMPRISING MORE THAN TWO INTERNAL BANKS OF DIFFERENT SIZES

BACKGROUND

A conventional semiconductor memory device typically includes multiple memory banks where each memory bank has the same size (i.e., the same number of memory cells) and the same storage capacity. In particular, a standard memory architecture now commonly employed for dynamic random access memory (DRAM) includes four memory banks of equal size. For example, a typical 64-Mbit DRAM has four banks, and each bank has a 16-Mbit storage capacity. An advantage of having multiple banks is that the banks can operate independently so that multiple pages, e.g., one in each bank, can remain simultaneously active. Accordingly, the probability of a page hit is higher, and the multi-bank memory typically provides an average data rate or bandwidth that is higher than the average data rate or bandwidth of a single-bank memory of the same size. A disadvantage of having multiple banks is the additional overhead circuits required when implementing the same functions in parallel in multiple banks. With these tradeoffs, four banks are suitable for a typical memory architecture.

As memory capacities have increased, the sizes of the banks have proportionally increased. For example, with the standard four-bank architecture, each bank in a 256-Mbit DRAM has a 64-Mbit capacity, and each bank in a 1-Gbit or larger DRAM must contain 256 Mbits or more of storage.

Large banks in a semiconductor memory device can reduce memory performance particularly when multiple master devices access the semiconductor memory device. For example, for full utilization of memory capacity, a master device requiring a relatively small buffer (i.e., smaller than a bank) often shares a bank with another master device. However, independent master devices commonly require different data, and the probability of an access causing a page miss, which degrades performance, is high when two master devices share the same bank. For example, a page miss results if a second master accesses a second word line of a first memory bank after a first master accesses a first word line of the first memory bank.

FIG. 4 shows a conventional read operation when a first row is currently selected in a bank but the read operation accesses a second row in the bank. With this page miss in the bank, an initial command at a time T0 causes pre-charging of the word lines of the target bank. The precharging requires a precharge time tRP. The following command at time T2 causes a delay time tRCD for activating or enabling the second word line. At time T4, after enabling the second word line, a time CL (CAS Latency) is required for receiving a column address and outputting the data at time T6. In contrast, consecutive accesses of memory cells on the same row line in a bank require only the CAS latency time CL for output of data. Accordingly, having a series of interleaved accesses of different row lines causes significant delays and significantly degrades the system's performance.

To improve system performance, a memory device is needed that reduces the probability of page misses and increases the probability of page hits even when used with multiple masters. One way to reduce page misses and increase page hits is to include more (and therefore smaller) banks in a memory device so that no two masters share the same bank. However, increasing the number of banks increases the required amount of overhead circuitry, which increases the area and cost of an integrated memory circuit.

Accordingly, memory technology needs memory architectures and methods that reduce page misses in a system with multiple master devices without significantly increasing the overhead circuitry or cost of the integrated memory device.

SUMMARY

In accordance with an aspect of the invention, a semiconductor device has multiple memory banks having different sizes for use with multiple master devices. With this architecture, each master device can be assigned a bank or banks having storage capacity matching the storage requirements of the master device. Accordingly, master devices that might interleave accesses to different data are more easily prevented from interleaved accesses to different row lines in the same bank. This reduces the number of page misses and improves average bandwidth or data rate of the memory.

One embodiment of the invention is an integrated circuit memory such as an SDRAM that includes a first memory bank containing a first number of memory cells and a second memory bank containing a second number of memory cells, wherein the second number differs from the first number. The first bank has a first row decoder that can keep a row line in the first bank activated for access to a memory cell in the first bank while a second row decoder in the second bank keeps another row line in the second bank activated for access. Generally, since the banks have different sizes, the number of bits in an internal row address provided to the first row decoder often differs from the number of bits in an internal row address provided to a second row decoder. Third and subsequent banks in the memory can have sizes that are the same as or different from the sizes of the first and second banks.

Another embodiment of the invention is a system including a plurality of master devices and an integrated circuit memory. The master devices include a first master device requiring a first buffer having a first size and a second master device requiring a second buffer having a second size that differs from the first size. The integrated circuit memory, which provides storage that implements the first and second buffers, includes a plurality of banks including a first bank containing a first number of memory cells and a second bank containing a second number of memory cells, the second number differing from the first number. To reduce page misses during memory accesses, the first master device is configured to access the first bank for access to the first buffer, and the second master device is configured to access the second bank for access to the second buffer. Typically, a memory control circuit controls access to the integrated circuit memory from the master devices.

Yet another embodiment of the invention is a method for operating a system including multiple master devices where each master device requires a buffer. This method includes: employing an integrated circuit memory comprising a plurality of banks wherein at least two of the banks differ from each other in size; assigning the plurality of banks to the plurality of master devices so that each master device has a corresponding bank and the corresponding bank has a size sufficient for the buffer that the master device requires; and directing access operations of each master device to the corresponding bank. The method can interleave a first master device's access of a first row address and a second master device's accesses of a second row address such that the first and second master devices access different banks. Accordingly, the interleaved access do not cause repeated page misses that would requires pre-charging or re-activation of the first row line after each access by the second master device.

BRIEF DESCRIPTION OF THE DRAWINGS

Use of the same reference symbols in different figures indicates similar or identical items.

DETAILED DESCRIPTION

The present invention improves the performance of systems or circuits including memory by reducing the probability of page misses and increasing the probability of page hits when interleaved accesses of the memory are for different purposes. In accordance with one aspect of the invention, a semiconductor device reduces page misses by having internal memory banks of different sizes. Ideally, each bank is matched to a purpose for memory accesses and has a size suitable for the purpose. In particular, the use of the memory can be selected so that two master devices that interleave accesses to the memory for different purposes do not access the same bank.

Figure 1:
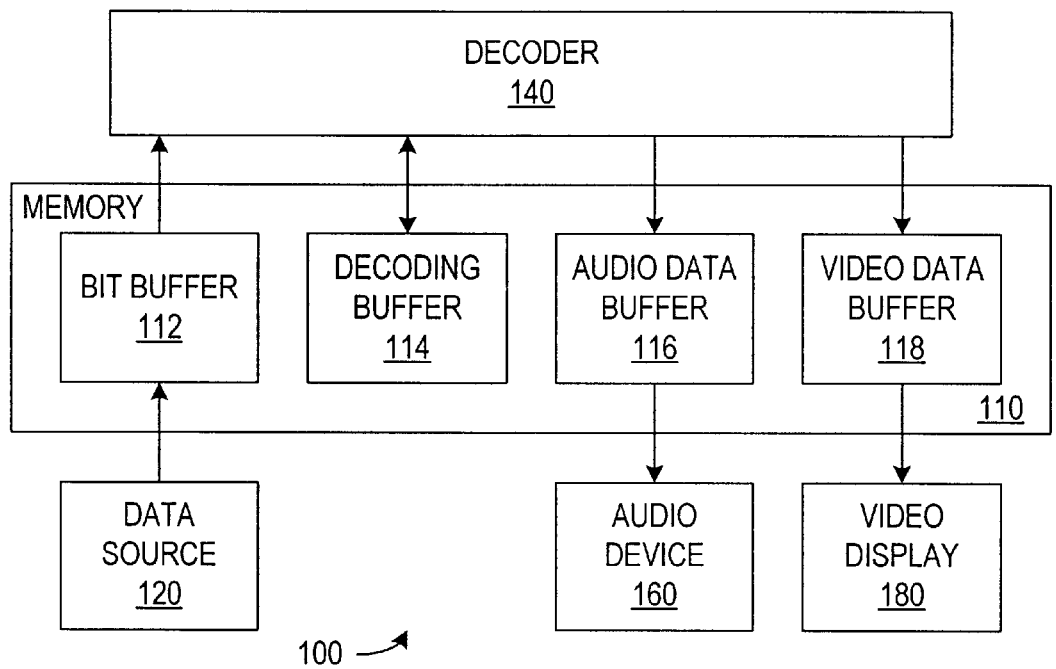
FIG. 1 is a block diagram illustrating a system in accordance with an embodiment of the present invention.

For illustrative purposes, operation of a digital television 100 in accordance with an embodiment of the invention illustrated in FIG. 1 is now described. Other similar features and advantages of the invention will be apparent for any other system that employs a semiconductor memory device for multiple purposes. Such systems include but are not limited to set-top boxes, digital camcorders, DVD players, DVD recorders, and PVRs.

As shown in FIG. 1, digital television 100 includes a memory 110 and multiple master devices. In an exemplary embodiment, memory 110 is an SDRAM integrated circuit (IC) or chip that implements a bit buffer 112, a decoding buffer 114, a sound buffer 116, and a video data buffer 118. In accordance with an aspect of the invention, each buffer 112, 114, 116, and 118 is a bank in memory 100 and has a bank size suitable for the buffer implemented. Alternatively, two or more of the buffers (e.g., the sound buffer and the video buffer) can share a bank. The master devices in digital television 100 include a data source 120, a decoder 140, an audio device 160, and a video display 180 that access specific buffers 112, 114, 116, and 118 in memory 110, as described further below.

Data source 120 transmits raw compressed data to bit buffer 110, which temporarily stores the compressed data. Generally, an electromagnetic wave or a cable carries a signal representing the compressed data. Data source 120 can include a tuner or any other circuit that receives the signal and generates raw data in the compressed format used in digital television 100. Generally, such sources write a raw data stream to consecutive memory addresses corresponding to the bit buffer/bank 112 so that most write operations cause a page hit and provide a high data bandwidth. In an exemplary embodiment of the invention, the raw data complies with MPEG2 standard, and a relatively small bank containing 16 Mbits of DRAM storage is sufficient for bit buffer 112.

Decoder 140 performs the arithmetic operations necessary to decode the raw data from bit buffer 112. In the decoding process, decoder 140 uses decoding buffer 114 for general storage and for operations adjusting the decoded data for a desired image size. In the exemplary embodiment, decoder 140 is an MPEG2 decoder, and decoding buffer 114 typically requires a total storage capacity between 64 and 96 Mbits of storage for MPEG decoding. Decoder 140 saves the decoded audio and video data in audio data buffer 116 and video data buffer 118. Generally, audio buffer 116 requires about 1 Mbit of DRAM storage, and video data buffer requires between 16 and 32 Mbits depending on the screen size for digital television 100. Audio device 160 receives sound data from audio buffer 116 and generates sounds. Video display 180 typically includes a graphics controller or other circuitry that generates displayed images using the video data from video data buffer 118.

In the exemplary embodiment, each buffer 114 is in a separate bank of memory 100, and the banks have different sizes according to the buffer or buffers implemented in the bank. An advantage of memory 110 in digital television 100 is the relatively low memory complexity and cost when compared to a system having multiple memory chips, one for each buffer. Additionally, when compared to a conventional design that employs a single memory IC, system 100 provides high performance and bandwidth by reducing page misses that result in a conventional memory when different master devices access different buffers in the same memory bank.

Advantages of the present invention can be further illustrated by comparison of a memory of a digital television that includes a semiconductor memory device having one 128Mb bank with a digital television having a semiconductor memory device including two 16-Mbit banks and one 96-Mbit bank. With such a memory, the 96-Mbit bank can contain decoding buffer 114. One 16-Mbit bank can contain bit buffer 112, and the other 16-Mbit bank can contain video buffer 118 and audio buffer 116. In this configuration, decoder 140 can access decoding buffer 114 in an efficient manner that avoids page misses that might be unavoidable if decoder 140 shared the bank containing decoding buffer 114 with another master device. Although audio device 160 and video display device 180 use buffers sharing a bank, accesses by audio device 160 are relatively infrequent and minimally impact memory performance.

Figure 2A:
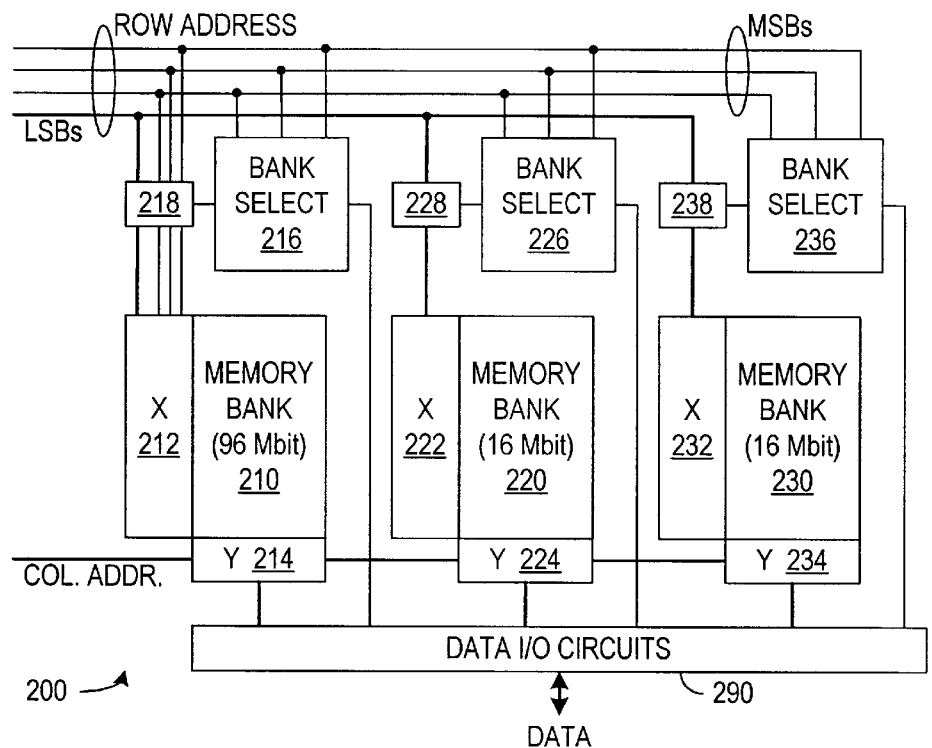
FIGS. 2A, 2B, 3A, and 3B are block diagram illustrating exemplary embodiments of memory having architectures suitable for use in the system of FIG. 1.

FIG. 2A illustrates a DRAM chip 200 that includes three memory banks 210, 220, and 230, where bank 210 has a storage capacity of 96 Mbits and banks 220 and 230 have a storage capacity of 16 Mbits each. Banks 210, 220, and 230 have respective row decoding circuits 212, 222, and 232 and respective column decoding circuits 214, 224, and 234 coupled to respective arrays of DRAM cells. The row decoding circuits, column decoding circuits, and DRAM cells can be of any design including the various conventional memory designs that are well known in the art.

For memory 200, an input row address includes three most significant bits (MSBs) that identify a bank 210, 220, or 230 for an access. Banks 210, 220, and 230 are in order of increasing row address and arranged so that the smallest banks correspond to the highest row addresses. A 3-bit signal is used in this embodiment because the smallest banks 220 and 230 occupy one eighth of the address space, and three address bits are needed to identify the particular eighth corresponding to bank 210 or 220. In some alternative embodiments of the invention, when the row address signal is used to distinguish the bank being accessed the number of bits required depends on the size of the smallest bank. As described further below, the order of the banks permits use of the MSBs of row address without change for selection of a bank and selection of a row line in the large bank 210.

In the embodiment of FIG. 2A, bank select circuits 216, 226, and 236 receive and decode the three MSBs of the row address. One of bank select circuits 216, 226, and 236 then activates an associated circuit 218, 228, or 238 to enable corresponding row decoding circuit 212, 222, or 232. If there is a page miss in the selected bank 210, 220, or 230, the enabled row decoding circuits 212, 222, and 232 activates a selected row line for a memory access, e.g., a read or write operation.

To identify the selected row line in the selected bank, the enabled row decoding circuits 212, 222, and 232 receives all or a portion of the row address signal depending on the size of the associated bank. Banks 220 and 230 contain 16 Mbits of storage, and row decoding circuits 222 and 232 do not require any of the three MSBs of the row address because the other row address bits uniquely identify a word line in the respective banks 220 and 230. Bank 210 contains 96 Mbits or six times the storage bank 220 or 230. Bank 210 also includes six times as many word lines as bank 220 or 230. Increasing the number of rows in this fashion allows banks 210, 220 and 230 to have identical column addressing*. However, to accommodate the larger number of word lines, row-decoding circuit 212 uses the three most significant bits. Those bits can be used without modification of a conventional row decoder if bank 210 corresponds to the lowest row address values.

Column decoding circuits 214, 224, and 234 include decoders, selection circuits, and sense amplifiers. In response to a column address, column decoding circuits 214, 224, and 234 output data signals read from selected columns in the respective banks or receive data signals for writing in selected memory cells connected to the selected columns. Data I/O circuits 290 select and output the data read from the selected array or provide the input data signals to be written in respective memory array. Such circuits are well known in the art and conventional designs can be employed for the column decoding circuits and data I/O circuits.

Figure 2B:
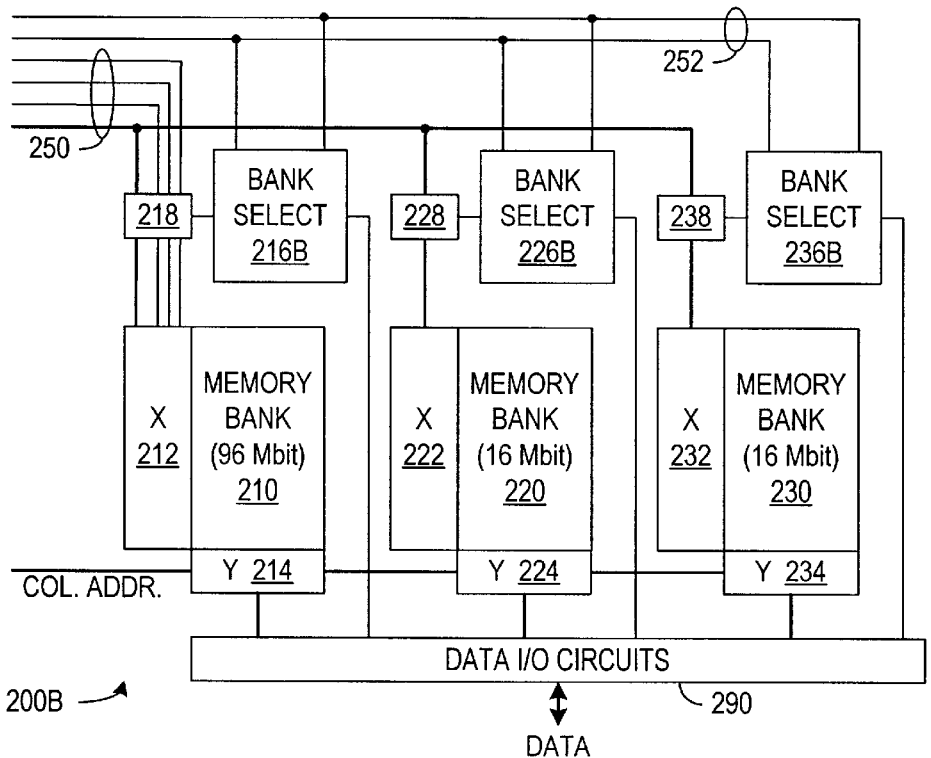

FIG. 2B shows a memory 200B according to an alternative embodiment of the invention. Memory 200B differs from memory 200 in that memory 200B uses a 2-bit signal 252 instead of the three MSBs of the row address signal for selection of the bank being accessed. The 2-bit signal 252 is sufficient to distinguish among the three banks 210, 220, and 230 (or up to four separate banks). Use of 2-bit signal 252 requires bank selection circuits 216B, 226B, and 236B in memory 200B that differ from the bank selection circuits 216, 226, and 236 in memory 200 of FIG. 2A, but elements of memory 200B are otherwise substantially identical to those described above for memory 200.

Signal 252 can be input to memory 200B as the most significant bits of an external row address signal that also includes signal 250 as the least significant bits (LSBs). Signal 250 contains at least as many bits as required to select a row in the largest bank 210. The smaller banks 220 and 230 require only some of the row address bits from signal 250. When an externally input row address signal includes signal 252 as MSBs and signal 250 as LSBs, external devices controlling memory 200B must limit the input row address signal to avoid undefined values. An undefined row address value includes MSBs 252 that select a bank and LSBs 250 that are outside the range of row line addresses permitted for bank 210. Alternatively, signal 252 could be considered a bank selection signal that is separate from the row address signal 250, but signal 252 normally requires the same timing as input row address signals, particularly in an SDRAM.

Memories 200 and 200B illustrate embodiments of the invention that are 128-MBit SDRAMs including three banks 210, 220, and 230 where at least two of the banks have different sizes. Alternative embodiments of the invention can have any size or number of banks. This particular embodiment has only three banks, which reduces the number of repeated circuits when compared to a four-bank memory. However, alternative embodiments of the invention can include four or more banks.

Figure 3A:
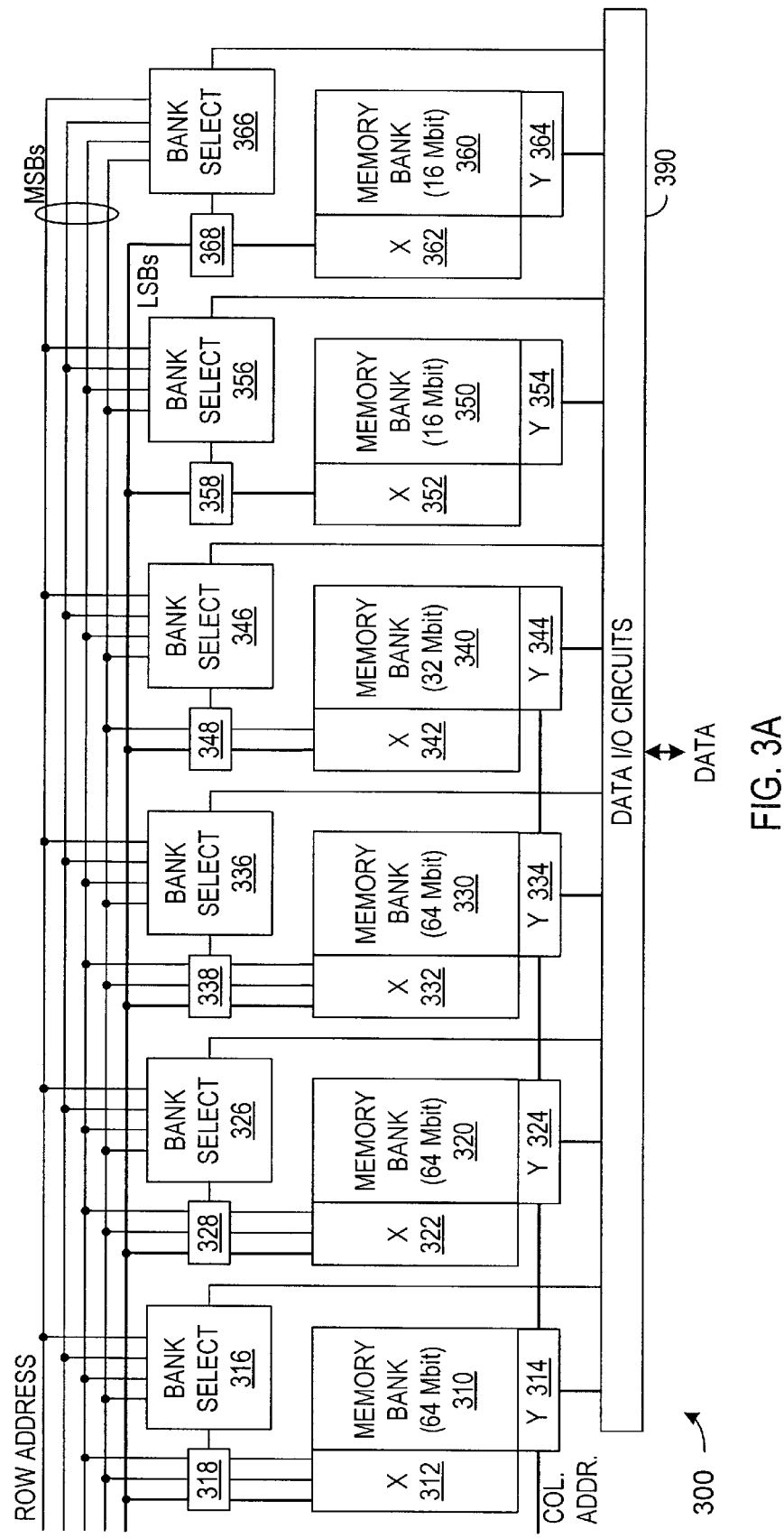

FIG. 3A is a block diagram of an alternative embodiment that is a 256-MBit SDRAM and includes six banks 310, 320, 330, 340, 350, and 360. Each of banks 310, 320, and 330 contains 64 Mbits of storage. Bank 340 contains 32 Mbits of storage, and banks 350 and 360 each contain 16 Mbits of storage. Banks 310, 320, 330, 340, 350, and 360 are in order of increasing row address. Each bank 310, 320, 330, 340, 350, or 360 has: an associated row decoding circuit 312, 322, 332, 342, 352, or 362; an associated column decoding circuit 314, 324, 334, 344, 354, or 364; and an associated bank select circuit 316, 326, 336, 346, 356, or 366.

Memory 300 and more particularly bank select circuits 316, 326, 336, 346, 356, and 366 use the four most significant bits of the row address to identify a bank 310, 320, 330, 340, 350, or 360 for an access. This embodiment uses four MSBs because the smallest bank 350 or 360 contains a sixteenth of the total capacity of memory 300. Accordingly, four bits can identify the particular sixteen corresponding to bank 350 or 360. The LSBs of the row address signal are sufficient to identify any row in bank 350 or 360. Bank 340 has twice as many rows as bank 350 or 360, and row-decoding circuit 342 requires the LSBs and one of the MSBs to uniquely select a word line in bank 340. Each of banks 310, 320, and 330 has four times as many rows as bank 350 or 360, and each of row decoders 312, 322, and 332 requires the LSBs and two of the MSBs to uniquely select a word line in bank 30.

Figure 3B:
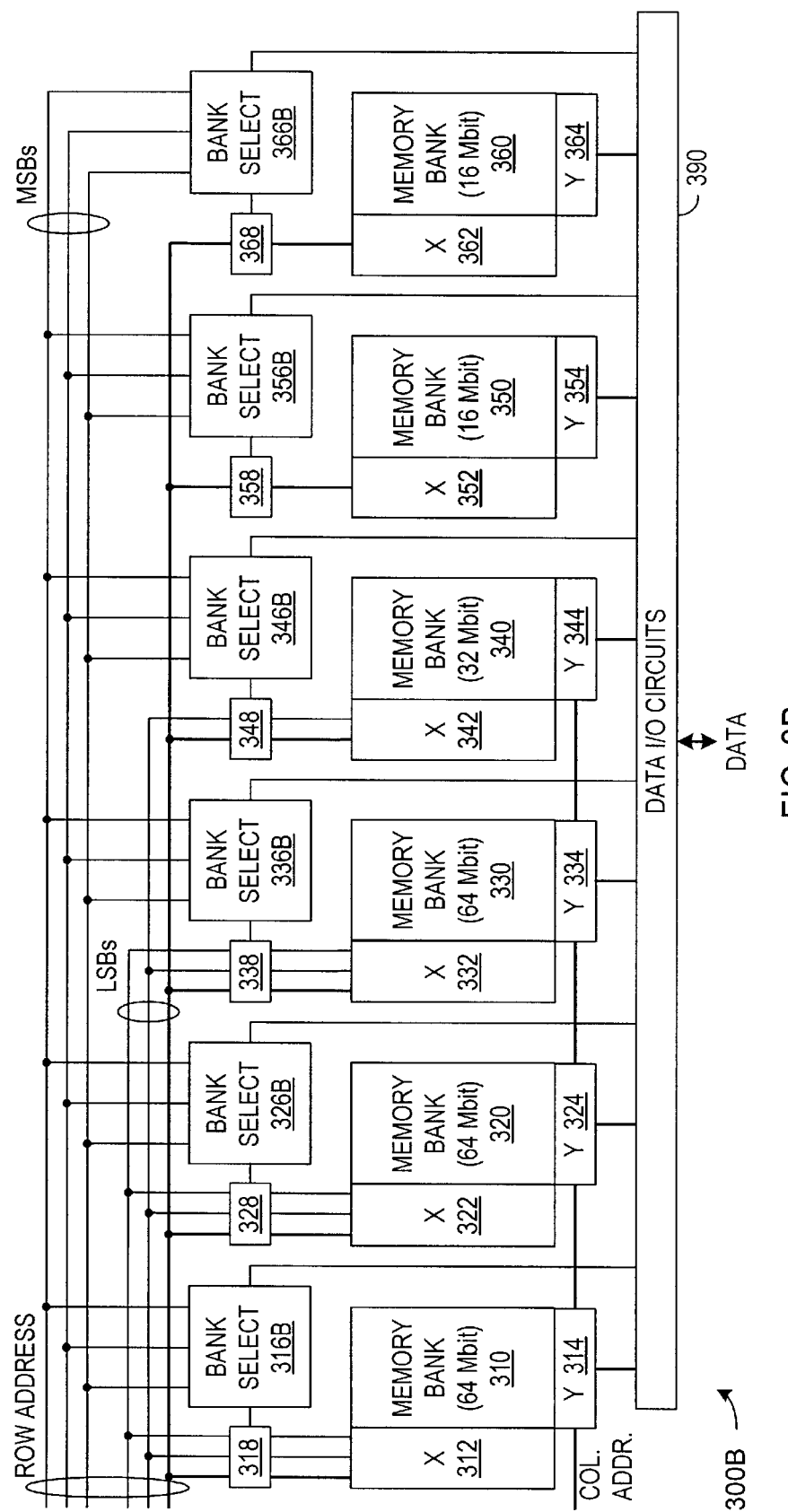

FIG. 3B shows an alternative 256-Mbit memory 300B, which has the same bank configuration as memory 300 of FIG. 3A. Memory 300B uses the three most significant bits of a row address signal to select one of the six banks 310, 320, 330, 340, 350, and 360. (Three bits are sufficient to distinguish among up to eight banks.) In memory 300B, the LSBs of the row address signal are sufficient to distinguish a row line in the largest bank 310, 320, or 330. Bank 340 requires fewer row address bits than do banks 310, 320, and 330 for identification of a row line, and banks 350 and 360 require fewer row address bits than does bank 340 for identification of a row line. In this embodiment, even though all banks have the same number of columns, the number of row lines in any of banks 310, 320, 330, 340, 350, and 360 is a power of 2 (i.e., $2^n$) where the power depends on the size of the bank.

Figure 4:
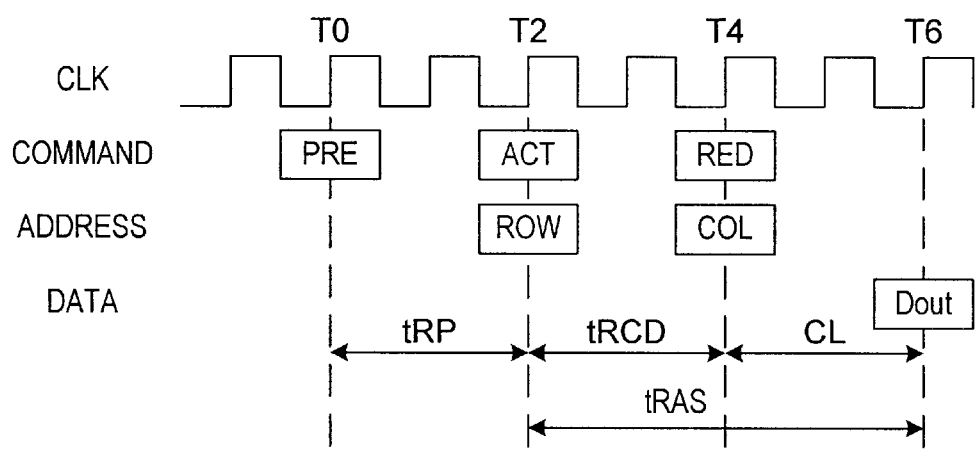
FIG. 4 is a timing diagram illustrating the effect of a page miss during a memory access.

As noted above, memories in accordance with the invention can reduce page misses by assigning no more than one buffer per bank and can maximize use of memory capacity when each buffer fills the bank or banks assigned to the buffer. Further, the memory and system architecture can avoid interleaved accesses of the same bank by different master devices, and reduce the chances of page misses. This provides higher performance because more access operations avoid the delays associated with the precharging time tRP and row selection time tRCD shown in FIG. 4 and provide memory accesses in a shorter time (e.g., the data output time CL of FIG. 4.)

Although the invention has been described with reference to particular embodiments, the description is only an example of the invention's application and should not be taken as a limitation. In particular, even though much of preceding discussion disclosed examples using SDRAM timing, the same concept can be applied in other kinds of memories such as DDR and RDRAM. Further, the digital TV described herein is merely an illustrative system including a memory, and other embodiments of the invention include many other systems including memory. Various other adaptations and combinations of features of the embodiments disclosed are within the scope of the invention as defined by the following claims.

I claim:

1. An integrated circuit memory comprising:
   a first memory bank containing a first number of memory cells, the first memory bank including a first buffer and configured to permit accesses to the first buffer by a first master device; and
   a second memory bank containing a second number of memory cells, the second memory bank including a second buffer and configured to permit accesses to the second buffer by a second master device, the second number of memory cells differing from the first number of memory cells.

2. The integrated circuit memory of claim 1, further comprising:
   a first row decoder coupled to the first memory bank; and
   a second row decoder coupled to the second memory bank, wherein
   the first row decoder call keep a first row line in the first memory bank activated for access of a memory cell in the first bank while the second row decoder keeps a second row line in the second memory bank activated for access of a memory cell in the second bank.

3. The integrated circuit memory of claim 2, further comprising an address circuit that receives an external address signal input to the memory and provides a first internal row address signal to the first row decoder and a second internal row address to the second row decoder.

4. The integrated circuit memory of claim 3, wherein the first row address signal includes more bits than are in the second row address signal.

5. The integrated circuit memory of claim 2, wherein the first row line corresponds to a first row address value and the second row line corresponds to a second row address value that differs from the first row address value.

6. The integrated circuit memory of claim 1, wherein the integrated circuit memory is a dynamic random access memory.

7. The integrated circuit memory of claim 1, further comprising a third memory bank containing a third number of memory cells.

8. The integrated circuit memory of claim 7, wherein the third number differs from the first and second numbers.

9. The integrated circuit memory of claim 7, wherein the third number is the same as one of the first and second numbers.

10. The integrated circuit memory of claim 1, further comprising a plurality of memory banks.

11. A system comprising:
    a plurality of master devices including a first master device requiring a first buffer having a first size and a second master device requiring a second buffer having a second size that differs from the first size; and
    an integrated circuit memory to provide storage that implements the first and second buffers, wherein the integrated circuit memory comprises a plurality of banks including a first bank containing a first number of memory cells and a second bank containing a second number of memory cells, the second number differing from the first number, wherein
    the first master device is configured to access the first bank for accesses to the first buffer and the second master device is configured to access the second bank for accesses to the second buffer.

12. The system of claim 11, further comprising a memory control circuit that controls access to the integrated circuit memory from the master devices.

13. The system of claim 11, wherein the integrated circuit memory further comprises:
    a first row decoder coupled to the first bank; and
    a second row decoder coupled to the second bank, wherein
    the first row decoder can keep a first row line in the first memory bank activated for access of a memory cell in the first bank while the second row decoder keeps a second row line in the second memory bank activated for access of a memory cell in the second bank, whereby interleaving accesses by the first master device to a first row address and an access by the second master device of a second row address does not cause a page miss that would require precharging or enabling of a row line in the first bank.

14. A method for operating a system including a plurality of master devices where each master device requires a buffer, the method comprising:
    employing an integrated circuit memory comprising a plurality of banks wherein at least two of the banks differ from each other in size;
    assigning the plurality of banks to the plurality of master devices so that each master device has a corresponding bank and the corresponding bank has a size sufficient for the buffer that the master device requires; and
    directing buffer access operations of each master device to the corresponding bank.

15. The method of claim 14, further comprising interleaving accesses by a first of the master devices to a first row address and an accesses by a second of master devices to a second row address, wherein accessing different banks does not cause a page miss that would require pre-charging or re-activation of the first row line after the access of the second master device.

16. The method of claim 14, wherein assigning the banks to the master devices comprising assigning a smallest one of the banks to a master device requiring a smallest buffer.

17. A semiconductor device that receives address signals and control signals and operates in synchronization with an external clock, comprising:
    a plurality of memory cell arrays comprising a plurality of memory cells;
    a first memory bank comprising a first set of said memory cell arrays;
    a second memory bank comprising a second set of said memory cell arrays;
    a first bank select circuit for receiving and decoding at least a portion of a row address signal and enabling a first row decoding circuit according to the decoded portion of the row address signal, the first row decoding circuit identifying a selected row line of the first memory bank using the row address signal;
    a second bank select circuit for receiving and decoding at least a portion of the row address signal and enabling a second row decoding circuit according to the decoded portion of the row address signal, the second row decoding circuit identifying a selected row line of the second memory bank using the row address signal.

18. The semiconductor device according to claim 17, further comprising a fourth memory bank having the same number of memory cells as in said first memory bank.

19. The semiconductor device according to claim 17, further comprising a fourth memory bank having the same number of memory cells as in said third memory bank.

20. The semiconductor device according to claim 17, further comprising a fourth memory bank having a smaller number of memory cells than are in said third memory bank.

21. The semiconductor device according to claim 20, further comprising a fifth memory having a smaller number of memory cells than are in said fourth memory bank.

22. A device comprising:

means for employing an integrated circuit memory comprising a plurality of banks wherein at least two of the banks differ from each other in size;

means for assigning the plurality of banks to a plurality of master devices so that each master device has a corresponding bank and the corresponding bank has a size sufficient for the buffer that the master device requires; and means for directing buffer access operations of each master device to the corresponding bank.

23. The device of claim 22, further comprising means for interleaving accesses by a first of the master devices to a first row address and accesses by a second of master devices to a second row address, wherein accessing different banks does not cause a page miss that would require pre-charging or re-activation of the first row line after the access of the second master device.

24. The device of claim 23, wherein the means for assigning the banks to the master devices comprises means for assigning a smallest one of the banks to a master device requiring a smallest buffer.

* * * * *